United States Patent
Hung et al.

(10) Patent No.: US 7,485,905 B2
(45) Date of Patent: Feb. 3, 2009

(54) ELECTROSTATIC DISCHARGE PROTECTION DEVICE

(75) Inventors: Feng-Chi Hung, Zhubei (TW);
Jian-Hsing Lee, Hsinchu (TW);
Hung-Lin Chen, Pingtung (TW);
Deng-Shun Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 184 days.

(21) Appl. No.: 11/459,650

(22) Filed: Jul. 25, 2006

(65) Prior Publication Data

US 2008/0023766 A1    Jan. 31, 2008

(51) Int. Cl.
*H01L 29/80* (2006.01)
*H01L 21/336* (2006.01)

(52) U.S. Cl. .............. 257/272; 257/273; 257/305; 257/307; 257/E29.174; 257/E29.176; 257/E27.015; 257/E27.017; 257/E27.109; 257/E21.619; 438/305; 438/307

(58) Field of Classification Search .......... 257/E29.174, 257/E29.196, E27.015, E27.017, E27.109, 257/272, 273, 370, 378, E21.619; 438/305, 438/307

See application file for complete search history.

(56) References Cited

U.S. PATENT DOCUMENTS

| 6,747,312 B2 * | 6/2004 | Boden, Jr. ............... 257/327 |
| 6,929,995 B2 * | 8/2005 | Chen ......................... 438/229 |
| 2006/0121681 A1 * | 6/2006 | Nandakumar ............ 438/302 |

* cited by examiner

*Primary Examiner*—Long K Tran
(74) *Attorney, Agent, or Firm*—Thomas, Kayden, Horstemeyer & Risley

(57) ABSTRACT

An electrostatic discharge protection device comprising a multi-finger gate, a first lightly doped region of a second conductivity, a first heavily doped region of the second conductivity, and a second lightly doped region of the second conductivity. The multi-finger gate comprises a plurality of fingers mutually connected in parallel over an active region of a first conductivity. The first lightly doped region of a second conductivity is disposed in the semiconductor substrate and between two of the fingers. The first heavily doped region of the second conductivity is disposed in the first lightly doped region of the second conductivity. The second lightly doped region of the second conductivity is beneath and adjoins the first lightly doped region of the second conductivity.

18 Claims, 4 Drawing Sheets

ELECTROSTATIC DISCHARGE PROTECTION DEVICE

BACKGROUND OF THE INVENTION

1. Field of the Invention

The invention relates to electrostatic discharge protection and, in particular, to an electrostatic discharge protection device applied in high voltage input/output (I/O).

2. Description of the Related Art

FIGS. 1A and 1B respectively show a layout and a cross section of a conventional double diffused drain (DDD) N-type metal oxide semiconductor (NMOS) device acting as an electrostatic discharge (ESD) protection device applied in high voltage input/output (I/O). The NMOS device comprises a poly gate 101 with multiple fingers, an N-type double diffused drain region 103, an N-type drain region 105, and two N-type source regions 107. The multiple fingers are mutually connected in parallel over a P-type substrate or active region 109 and together form the poly gate 101. The N-type double diffused drain region 103 is disposed in the P-type substrate or active region 109 and located between the two fingers of the poly gate 101. The N-type double diffused drain region 105 is disposed in the N-type double diffused drain region 103. The N-type source regions 107 are disposed in the substrate or active region 109 and on two sides of the poly gate 101.

In FIG. 1B, P-type guard rings are connected to a low voltage potential (Vss) such that the P-type substrate or active region 109 is biased at the low voltage potential and junctions between the N-type source regions 107 and the P-type substrate or active region 109 are not forward biased. The N-type source regions 107 are also connected to the low voltage potential (Vss). As shown in FIG. 1B, a parasitic bipolar junction transistor (BJT) is formed in the NMOS device. The N-type source regions 107, the P-type substrate or active region 109, and the N-type double diffused drain respectively act as emitters, bases, and collectors of the parasitic BJT. When the N-type drain region 105 is subject to an ESD pulse, the parasitic BJT is instantly turned on and a large ESD current is discharged through the NMOS device.

BRIEF SUMMARY OF THE INVENTION

An embodiment of an electrostatic discharge protection device comprises a multi-finger gate, a first lightly doped region of a second conductivity, a first heavily doped region of the second conductivity, and a second lightly doped region of the second conductivity. The multi-finger gate comprises a plurality of fingers mutually connected in parallel over an active region of a first conductivity. The first lightly doped region of a second conductivity is disposed in the semiconductor substrate and between two of the fingers. The first heavily doped region of the second conductivity is disposed in the first lightly doped region of the second conductivity. The second lightly doped region of the second conductivity is beneath and adjoins the first lightly doped region of the second conductivity.

The invention provides an electrostatic discharge device with double diffused drain (DDD) structure applied in high voltage input/output (I/O) in high voltage technology. A lightly doped region of the same conductivity as the double diffused drain (DDD) is formed adjoining the double diffused drain. As a result, current accumulating near the drain junction is suppressed such that ESD protection device is more robust.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
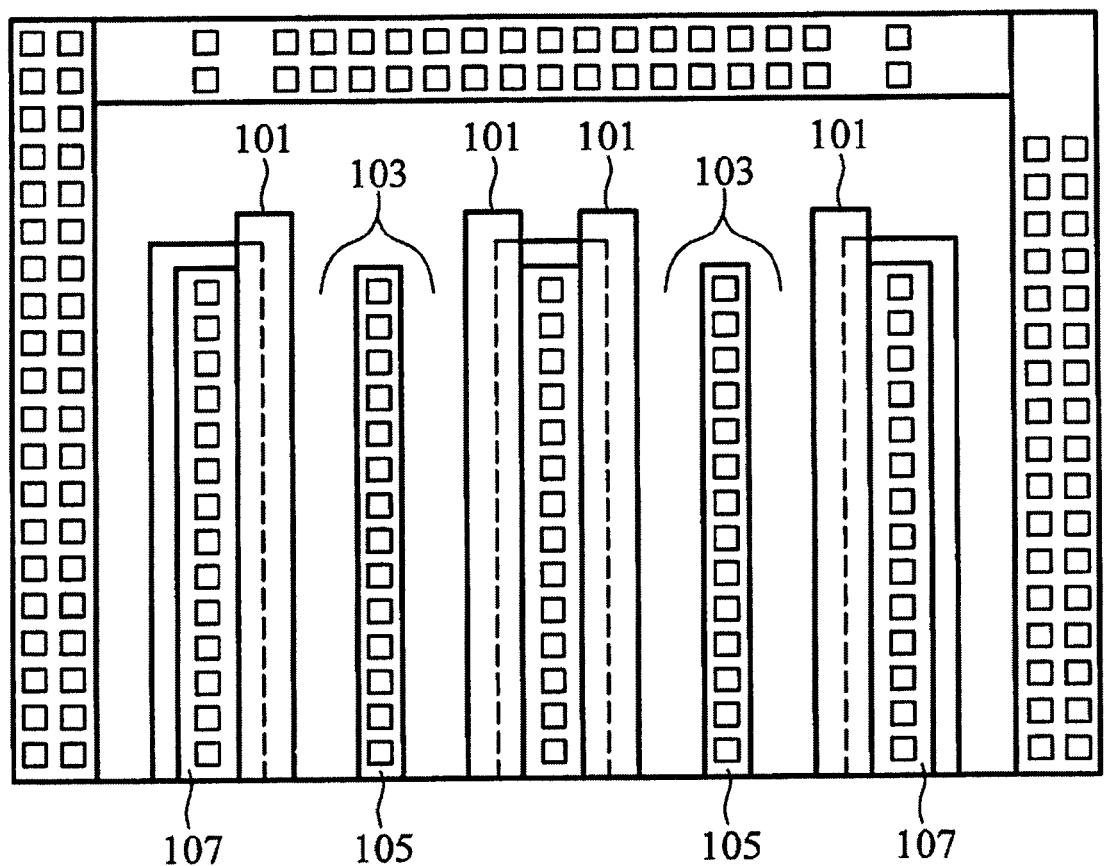
FIGS. 1A and 1B respectively show a layout and a cross section of a conventional double diffused drain (DDD) N-type metal oxide semiconductor (NMOS) device acting as an electrostatic discharge (ESD) protection device applied in high voltage input/output (I/O)
Figure 1B:
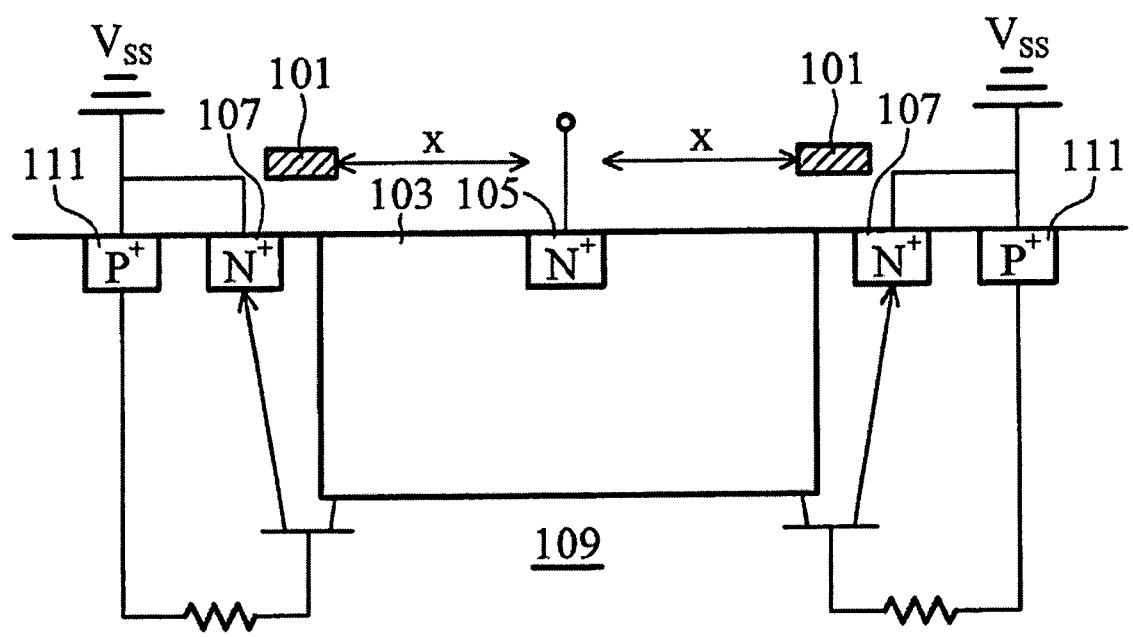
Figure 2A:
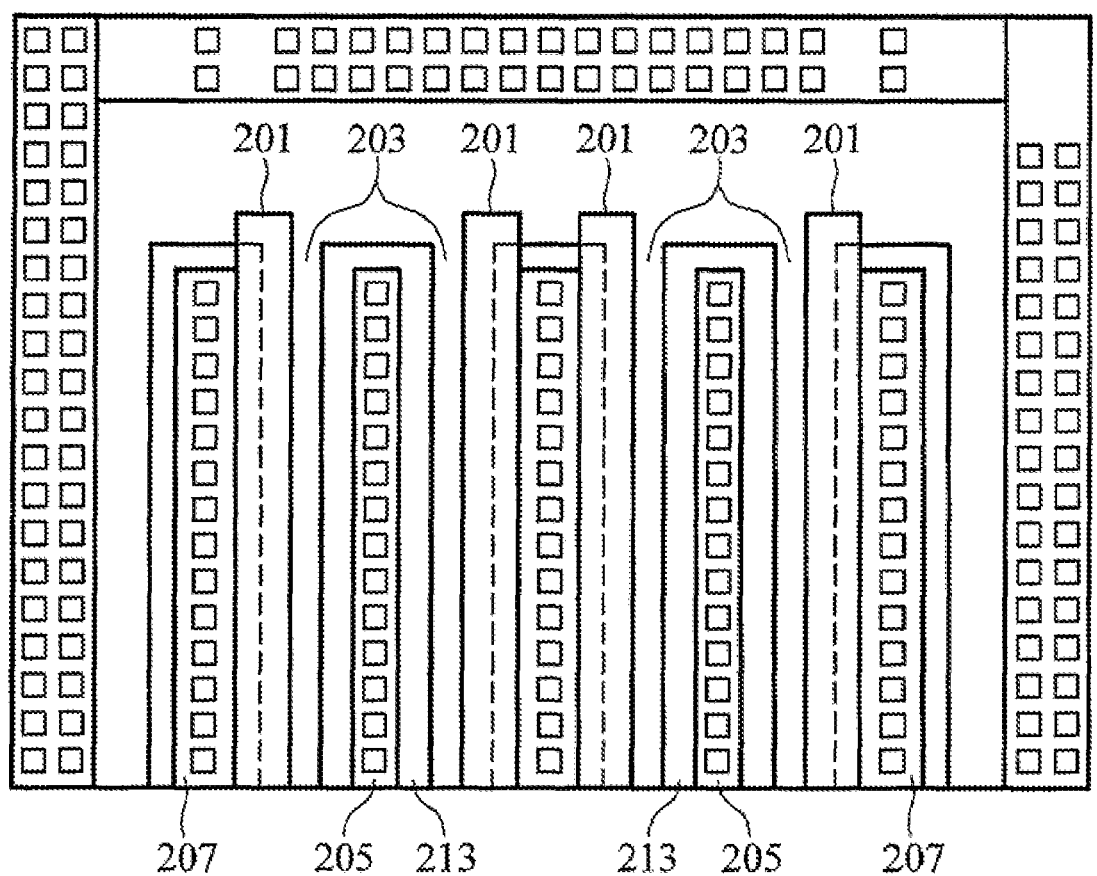
FIG. 2A shows a layout of a NMOS device with double diffused drain (DDD) structure according to an embodiment of the invention.
Figure 2B:
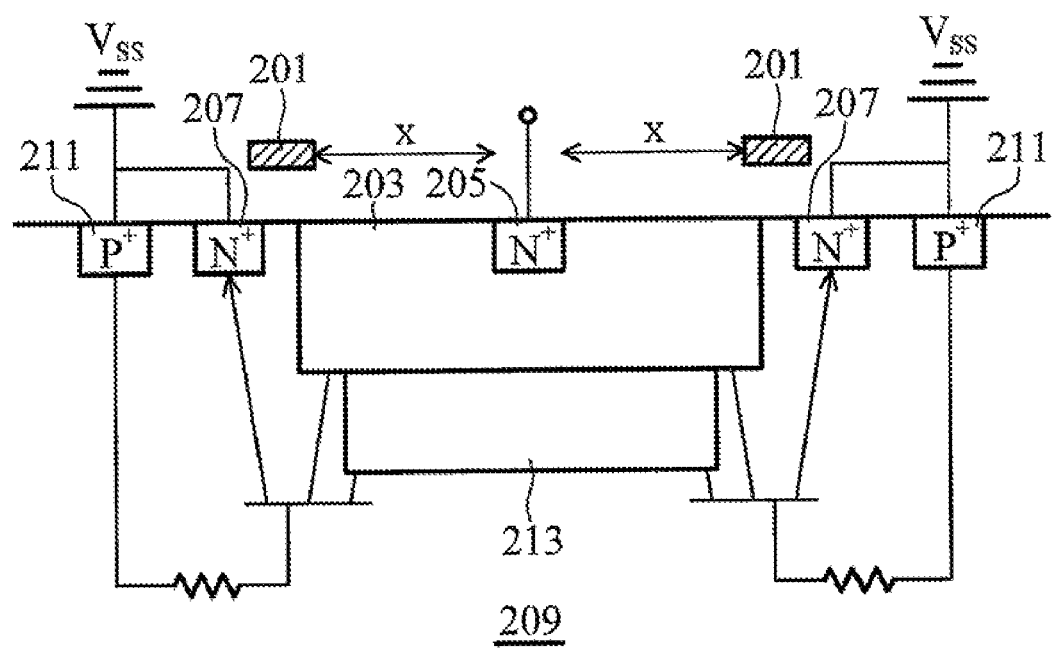
FIG. 2B is a cross section of the device along line A-A' of FIG. 2A.

FIGS. 2A and 2B are schematic diagrams of an electrostatic discharge protection device according to an embodiment of the invention. FIG. 2A shows a layout of a NMOS device with double diffused drain (DDD) structure and FIG. 2B is a cross section of the device along line A-A' of FIG. 2A. NMOS transistors are used here as an example. The scope of the invention, however, is not limited thereto.

As shown in FIGS. 2A and 2B, the NMOS device comprises a poly gate 201 with multiple fingers, an N-type double diffused drain region 203, an N-type drain region 205, two N-type source regions 207, and an N-well 213. The two fingers are mutually connected in parallel over a P-type substrate or active region 209 and together form the poly gate 201. The N-type double diffused drain region 203 is disposed in the P-type substrate or active region 209 and located between the fingers of the poly gate 201. Preferably, the N-type double diffused drain region 203 is doped with phosphorous at a dosage of 1E12 to 1E13 $cm^{-2}$. The N-type drain region 205 is disposed in the N-type double diffused drain region 203. Preferably, the N-type drain region 205 is doped with phosphorous at a dosage of 1E12 to 1E13 $cm^{-2}$. The N-type source regions 207 are disposed in the active region 209 on two sides of the poly gate 201. The N-well 213 is beneath and adjoins the N-type double diffused drain region 203. More specifically, the P-type substrate or active region is a P-well or a P-type substrate.

In FIG. 2B, P-type pickup regions (or guard rings) 211 are connected to a low voltage potential (Vss) such that the P-type substrate or active region 209 is biased at the low voltage potential and junctions between the N-type source regions 207 and the P-type active region 209 are not forward biased. The N-type source regions 207 are also connected to the low voltage potential (Vss). As shown in FIG. 2B, a parasitic bipolar junction transistor (BJT) is formed in the NMOS device. The N-type source regions 207, the P-type active region 209, the N-well 213 and the N-type double diffused drain 203 respectively act as emitters, bases, and collectors of the parasitic BJT. When the N-type drain region 205 is subject to an ESD pulses the parasitic BJT is instantly turned on and a large ESD current is discharged through the NMOS device.

Table I shows experimental results of ESD testing for conventional DDD NMOS devices and DDD NMOS devices according to an embodiment of the invention. The ESD tests are respectively carried out for human body mode (HBM) and machine mode (MM). IT2 is a trigger current of second breakdown of the ESD protection devices in a transmission line pulse (TLP) ESD test. X is the distance between edges of the N-type drain region and the fingers of the poly gate of the ESD protection devices and TW total width of the ESD protection devices. The table I shows that the trigger current of second breakdown of the ESD protection devices with an additional N-well exceeds 1.4 A, higher than ESD protection devices without the additional N-well. In addition, the ESD protection devices with the additional N-well pass ESD pulse test of HBM at 2 KV and MM at 200V, indicating that the ESD protection devices with the additional N-well provide superior ESD performance.

TABLE I

| NW  | X(μm) | TW(μm) | HBM(KV)      | MM(V)         | IT2(A) |
|-----|-------|--------|--------------|---------------|--------|
| w/o | 1.5   | 100    | 0.5, 1, 1    | 100, 150, 100 |        |
| w/o | 1.5   | 200    | 1, 1, 1      | 150, 150, 100 | 1.35   |
| w/o | 1.5   | 300    | 1.5, 1, 0.5  | 50, 50, 100   |        |
| w/o | 2.0   | 100    | 0.5, 1, 1    | 150, 150, 150 |        |
| w/o | 2.0   | 200    | 1, 1, 0.5    | 200, 150, 100 | 1.14   |
| w/o | 2.0   | 300    | 1.5, 1, 1    | 100, 150, 100 |        |
| w/o | 3.0   | 100    | 0.5, 1, <0.5 | <50, 100, 100 |        |
| w/o | 3.0   | 200    | 1, 0.5, 0.5  | 200, <50, 150 | 0.0    |
| w/o | 3.0   | 300    | 0.5, 0.5, 0.5| <50, <50, 100 |        |
| w/i | 3.0   | 200    | 2, 2.5, 2.5  | 200, 250, 250 | 1.4    |
| w/o | 4.0   | 100    | 0.5, 0.5, <0.5| <50, 150, 100 |       |
| w/o | 4.0   | 200    | 1, 0.5, 0.5  | <50, <50, <50 | 0.0    |
| w/o | 4.0   | 300    | 0.5, 0.5, 1  | <50, <50, 50  |        |
| w/i | 4.0   | 200    | 2, 2.5, 2.5  | 300, 250, 250 | 1.43   |

The invention provides an electrostatic discharge device with double diffused drain (DDD) structure applied in high voltage input/output (I/O). A lightly doped region of the same conductivity as the double diffused drain (DDD) is formed adjoining the double diffused drain. As a result, current accumulating near the drain junction is suppressed such that ESD protection device is more robust.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge protection device, comprising:
   a multi-finger gate comprising a plurality of fingers mutually connected in parallel over an active region of a first conductivity;
   a first lightly doped region of a second conductivity in the active region between two of the fingers;
   a first heavily doped region of the second conductivity disposed in the first lightly doped region of the second conductivity;
   a second lightly doped region of the second conductivity beneath and adjoining the first lightly doped region of the second conductivity; and
   two second heavily doped regions of the second conductivity disposed in the semiconductor substrate, wherein the fingers are located between the two second heavily doped regions of the second conductivity.

2. The electrostatic discharge protection device as claimed in claim 1, wherein the active region of the first conductivity is a well region or a semiconductor substrate of the first conductivity.

3. The electrostatic discharge protection device as claimed in claim 1, further comprising a pickup region of the first conductivity in the active region of the first conductivity such that the active region is biased via the pickup region.

4. The electrostatic discharge protection device as claimed in claim 1, wherein the two second heavily doped regions and the pickup region are connected.

5. The electrostatic discharge protection device as claimed in claim 1, wherein the first lightly doped region of the second conductivity is doped with phosphorous at a dosage of 1E12 to 1E13 $cm^{-2}$.

6. The electrostatic discharge protection device as claimed in claim 1, wherein the second lightly doped region of the second conductivity is doped with phosphorous at a dosage of 1E12 to 1E13 $cm^{-2}$.

7. An integrated circuit comprising an electrostatic discharge protection device, the electrostatic discharge protection device comprising:
   a multi-finger gate comprising a plurality of fingers mutually connected in parallel over an active region of a first conductivity;
   a first lightly doped region of a second conductivity in the active region between two of the fingers;
   a first heavily doped region of the second conductivity disposed in the first lightly doped region of the second conductivity;
   a second lightly doped region of the second conductivity beneath and adjoining the first lightly doped region of the second conductivity, wherein the second lightly doped region of the second conductivity narrower than the first lightly doped region of the second conductivity; and
   two second heavily doped regions of the second conductivity disposed in the semiconductor substrate, wherein the fingers are located between the two second heavily doped regions of the second conductivity.

8. The integrated circuit as claimed in claim 7, wherein the active region of the first conductivity is a well region or a semiconductor substrate of the first conductivity.

9. The integrated circuit as claimed in claim 7, further comprising a pickup region of the first conductivity in the active region of the first conductivity such that the active region is biased via the pickup region.

10. The integrated circuit as claimed in claim 7, wherein the two second heavily doped regions and the pickup region are connected.

11. The integrated circuit as claimed in claim 7, wherein the first lightly doped region of the second conductivity is doped with phosphorous at a dosage of 1E12 to 1E13 $cm^{-2}$.

12. The integrated circuit as claimed in claim 7, wherein the second lightly doped region of the second conductivity is doped with phosphorous at a dosage of 1E12 to 1E13 $cm^{-2}$.

13. An electrostatic discharge protection device, comprising:
   a multi-finger gate comprising a plurality of fingers mutually connected in parallel over an active region of a first conductivity;
   a double diffused drain (DDD) region of a second conductivity in the active region between two of the fingers; and
   a lightly doped region of the second conductivity beneath and adjoining the DDD region.

14. The electrostatic discharge protection device as claimed in claim 13, wherein the active region of the first conductivity is a well region or a semiconductor substrate of the first conductivity.

15. The electrostatic discharge protection device as claimed in claim 13, further comprising two heavily doped regions of the second conductivity disposed in the semiconductor substrate, wherein the fingers are located between the two heavily doped regions of the second conductivity.

16. The electrostatic discharge protection device as claimed in claim 15, further comprising a pickup region of the first conductivity in the active region of the first conductivity such that the active region is biased via the pickup region.

17. The electrostatic discharge protection device as claimed in claim 13, wherein the two heavily doped regions and the pickup region are connected.

18. The electrostatic discharge protection device as claimed in claim 13, wherein the lightly doped region of the second conductivity is doped with phosphorous at a dosage of 1E12 to 1E13 $cm^{-2}$.

* * * * *